(12) United States Patent
Cabral, Jr. et al.

(10) Patent No.: US 7,851,357 B2
(45) Date of Patent: Dec. 14, 2010

(54) METHOD OF FORMING ELECTRODEPOSITED CONTACTS

(75) Inventors: Cyril Cabral, Jr., Mahopac, NY (US);
Lili Deligianni, Tenafly, NJ (US);
Randolph F. Knarr, Yorktown Heights, NY (US); Sandra G. Malhotra, Beacon, NY (US); Stephen Rossnagel, Pleasantville, NY (US); Xiaoyan Shao, Yorktown Heights, NY (US); Anna Topol, Yorktown Heights, NY (US); Philippe M. Vereecken, Leuven (BE)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 12/130,381

(22) Filed: May 30, 2008

(65) Prior Publication Data

US 2009/0014878 A1 Jan. 15, 2009

Related U.S. Application Data

(62) Division of application No. 11/308,433, filed on Mar. 24, 2006, now Pat. No. 7,405,154.

(51) Int. Cl.
*H01L 21/4763* (2006.01)
(52) U.S. Cl. .................... 438/637; 438/643; 438/672; 257/E21.577; 257/E21.578
(58) Field of Classification Search ................ 438/622, 438/626–631, 634, 636, 637, 643, 656, 672, 438/678; 257/E21.577, E21.578
See application file for complete search history.

(56) References Cited

U.S. PATENT DOCUMENTS 6,635,498 B2 10/2003 Summerfelt et al.
6,709,562 B1 3/2004 Andricacos et al.
6,755,957 B2 6/2004 Nakamura et al.
6,787,912 B2 9/2004 Lane et al.

(Continued)

OTHER PUBLICATIONS

Ionized Physical Vapor Deposition of Integrated Circuit Interconnects; J. Hopwood; Physics of Plasmas, vol. 5, No. 5; May 1998; pp. 1624-1631.

*Primary Examiner*—Hoai V Pham
(74) *Attorney, Agent, or Firm*—Connolly Bove Lodge & Hutz LLP; Louis Percello

(57) ABSTRACT

A contact metallurgy structure comprising a patterned dielectric layer having cavities on a substrate; a silicide or germanide layer such as of cobalt and/or nickel located at the bottom of cavities; a contact layer comprising Ti or Ti/TiN located on top of the dielectric layer and inside the cavities and making contact to the silicide or germanide layer on the bottom; a diffusion barrier layer located on top of the contact layer and inside the cavities; optionally a seed layer for plating located on top of the barrier layer; a metal fill layer in vias is provided along with a method of fabrication. The metal fill layer is electrodeposited with at least one member selected from the group consisting of copper, rhodium, ruthenium, iridium, molybdenum, gold, silver, nickel, cobalt, silver, gold, cadmium and zinc and alloys thereof. When the metal fill layer is rhodium, ruthenium, or iridium, an effective diffusion barrier layer is not required between the fill metal and the dielectric. When the barrier layer is platable, such as ruthenium, rhodium, platinum, or iridium, the seed layer is not required.

8 Claims, 9 Drawing Sheets

U.S. PATENT DOCUMENTS

| | | |
|---|---|---|
| 6,800,188 B2 | 10/2004 | Hagiwara et al. |
| 6,884,736 B2 | 4/2005 | Wu et al. |
| 2003/0092254 A1 | 5/2003 | Walker et al. |
| 2004/0035316 A1 | 2/2004 | Chebiam et al. |
| 2004/0166659 A1 | 8/2004 | Lin et al. |
| 2004/0173909 A1 | 9/2004 | Sinha et al. |
| 2004/0219779 A1 | 11/2004 | Basol et al. |
| 2006/0251800 A1 | 11/2006 | Weidman et al. |
| 2006/0252252 A1 | 11/2006 | Zhu et al. |
| 2007/0099422 A1 | 5/2007 | Wijekoon et al. |
| 2007/0108063 A1 | 5/2007 | Nakada et al. |
| 2007/0111519 A1 | 5/2007 | Lubomirsky et al. |

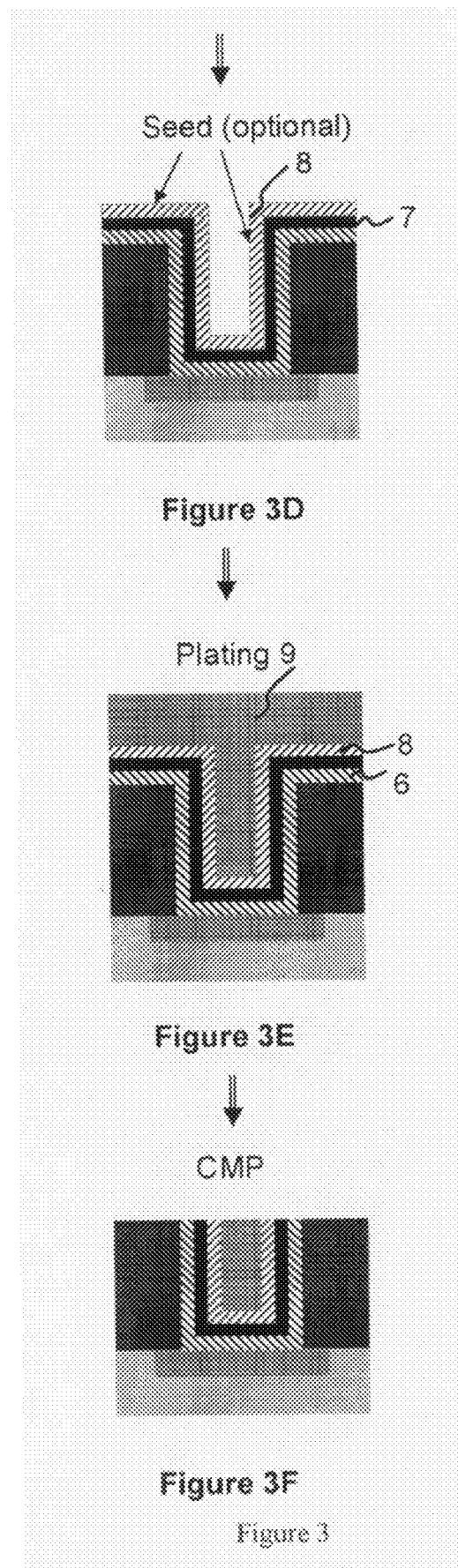

METHOD OF FORMING ELECTRODEPOSITED CONTACTS

This application is a Divisional Application of U.S. patent Ser. No. 11/308,433, filed Mar. 24, 2006, the entire disclosures of which are herein incorporated by reference in their entireties.

TECHNICAL FIELD

The present disclosure relates to contact metallurgy structures in microelectronics and particularly to structures that are capable of exhibiting reduced plug resistance when compared to the existing CVD tungsten plug metallization technology.

The innovative metallurgy structures of the present disclosure are especially important for applications which require contacts with high aspect ratio and small critical dimensions (CD-smaller than 100 nm) cavities (vias, bars, and trenches). The present disclosure also relates to methods of fabricating the contact metallurgy structures. In particular, the metallurgy used in this disclosure enables reduced resistance of contact structures, by electrochemically filling the cavities with lower resistivity materials other than CVD W. The fill materials are chosen from a group of platable metals which also exhibit low resistance values, and they included but are not limited to: copper (Cu), rhodium (Rh), ruthenium (Ru), iridium (Ir), molybdenum (Mo), silver (Ag), gold (Au), cobalt (Co), nickel (Ni), cadmium (Cd) and zinc (Zn) and alloys thereof. Among them, Cu, Rh, and Ru are found to be the most promising.

BACKGROUND

Advances over the years in the field of interconnection and device technology have played an important role in allowing continued scaling of the CMOS-based microelectronic products. In particular, scaling enabled improved device density and enhanced circuit performance. However, the increasing parasitic resistance in the nanometer regime is a key challenge in scaling of high performance CMOS devices. Series resistance components add to the degradation of intrinsic device current capability which directly impacts device performance. The continuing miniaturization of integrated circuits leads to increased parasitic resistance not only in the front-end-of-the-line (FEOL) level but also in the middle-end-of-the-line (MOL) and back-end-of-the-line (BEOL) levels as decreased geometry results in increased resistivity of the interconnecting lines.

Increase of resistance of various device components has been a key parameter in predictive models of the ITRS roadmap. Up to the 65 nm Technology Node the MOL interconnection, i.e. contact level fabrication, has not been a key parasitic resistance contributor, but beyond this technology node predictions show that it will become an increasing issue. A comprehensive picture of contact level resistance scaling issues is depicted in FIG. 1. A simple predictive model shows that via resistance should increase by $1/k^2$ for every device generation, where k is the scaling factor. Due to the material limitations the resistance increase has been accelerating. Therefore, at 45 nm technology node innovative process solution based on liner thickness scaling had to be implemented to decrease the total plug resistance of the contact level build using W metallurgy. In addition to an increase in the nominal resistance value, process variability (3 sigma values) has also been increasing. As contact plug diameter shrinks below 50 nm any change in final critical dimension (CD) of a plug (diameter, height, side-wall angle) will result in large resistance variations. Such variations clearly degrade our ability to control yield and reliability of these vias beyond 45 nm technology node.

Tungsten is currently used for local wiring and for the contact level to the devices in microprocessors, ASICs and DRAMs. FIG. 2 shows how increasing contact resistance could result in 10% performance delay in F04 Inverter for 45 nm Technology Node if the current liner and CVD tungsten process is not optimized. More specifically, Curve A shows contact resistance increase with technology node for the current liner materials and tungsten fill processes. Curve B shows the F04 delay without the additional resistance contributed from contact plug. The curve C shows the actual F04 delay with the actual contact plug resistance. The difference between the latter two curves shows the contribution to the F04 delay from the contact plug resistance, which increases with technology node, and is predicted to reach 10% or more for 45 nm Technology Node if no additional innovative solutions are implemented to decrease plug resistance.

The most common metallization process for CA level includes deposition of I-PVD Ti layer for improved electrical contact to the silicide, a CVD TiN barrier protecting from corrosive W chemistry, followed by a CVD or ALD pulsed nucleation layer ("PNL"-doped W layer) followed by a CVD W fill. As CA dimensions are scaled the following issues become critical: inability to shrink a highly resistive liner and nucleation layers, lack of process providing W with lower resistivity values and good fill capability. The seam or voids in the contact plug becomes increasingly intolerable.

Therefore, providing contact metallurgy structures exhibiting reduced contact resistance by choosing lower resistivity materials to fill the plug, and minimizing center seam or voids for such structures is desirable.

SUMMARY

The present disclosure provides contact metallurgy structures capable of exhibiting reduced contact resistance while maintaining needed physical characteristics for such structures.

More particularly, the present disclosure relates to a contact metallurgy structure comprising a silicide or germanide layer, a patterned dielectric layer having cavities (e.g. vias, bars and/or trenches) landed on the silicide or germanide; a contact layer comprising Ti located on top of the dielectric layer and contacting the silicide or germanide layer at the bottom of the cavities; a diffusion barrier layer located in cavities and on top of the contact layer; optionally a seed layer located in cavities and on top of the diffusion barrier layer; and metal fill layer on top of the seed layer and in cavities. The metal fill layer comprises at least one member selected from the group consisting of copper, rhodium, ruthenium, iridium, molybdenum, gold, silver, nickel, cobalt, cadmium and zinc and alloys thereof, from electrodeposition. Examples of alloys of theses metal include alloys with other metals, such as W, and/or with light doping elements including P, B, S, Cl, O, C, N, F, Br, and I.

Another aspect of the present disclosure is concerned with a method for fabricating a contact metallurgy structure. The method comprises forming a silicide or germanide layer located on top of a silicon or geranium arsenide substrate, respectively; obtaining a patterned dielectric layer having cavities landing on top of silicide or germanide layer; providing a contact layer comprising Ti located at the bottom of cavities and on top of the dielectric layer; depositing a diffusion barrier layer located in cavities and on top of the contact layer; optionally depositing a seed layer in cavities and on top of the diffusion barrier layer; and electroplating a metal to fill the cavities and on top of the seed layer, with the metal being at least one member selected from the group consisting of copper, rhodium, ruthenium, iridium, molybdenum, gold, silver, nickel, cobalt, cadmium and zinc and alloys thereof. Examples of alloys of theses metal include alloys with other metals, such as W, and/or with light doping elements including P, B, S, Cl, O, C, N, F, Br, and I.

The present disclosure also relates to contact metallurgy structures obtained by the above process.

Another aspect of the present disclosure is concerned with a method for fabricating a contact metallurgy structure. The method comprises forming a silicide or germanide layer located on top of silicon or geranium arsenide substrate, respectively; obtaining a patterned dielectric layer having cavities landing on top of the silicide or germanide layer; providing a contact layer comprising Ti located at the bottom of cavities and on top of the dielectric layer; depositing a diffusion barrier layer located in cavities and on top of the contact layer, with the diffusion barrier layer being a platable metal, such as ruthenium, platinum, rhodium, iridium; and electroplating a metal to fill the cavities and on top of the seed layer, with the metal being at least one member selected from the group consisting of copper, rhodium, ruthenium, iridium, molybdenum, silver, gold, cobalt, nickel, cadmium and zinc and alloys thereof.

Another aspect of the present disclosure is concerned with structures obtained by the above method.

A still further aspect of the present disclosure is concerned with a method for fabricating a contact metallurgy structure. The method comprises forming a silicide or germanide layer located on top of silicon or geranium arsenide substrate, respectively; obtaining a patterned dielectric layer having cavities landing on top silicide or germanide layer; providing a contact layer comprising Ti located at the bottom of cavities and on top of the dielectric layer; depositing a seed layer in vias and on top of the contact layer, wherein the seed layer is conductive and platable, and does not diffuse through the contact layer into silicon and dielectrics, such as Ru, Rh, Pt, Ir, Pd, W, etc.; and electroplating a metal to fill the vias and on top of the seed layer, with the metal being at least one member selected from the group consisting of rhodium, ruthenium, and iridium and alloys thereof.

Another aspect of the present disclosure is concerned with structures obtained by the above method.

The present disclosure also relates to microelectronic devices employing the above contact metallurgy structures and their method of fabrication.

Still other objects and advantages of the present disclosure will become readily apparent by those skilled in the art from the following detailed description, wherein it is shown and described only the preferred embodiments, simply by way of illustration of the best mode. As will be realized, the disclosure is capable of other and different embodiments, and its several details are capable of modifications in various obvious respects, without departing from the disclosure. Accordingly, the description is to be regarded as illustrative in nature and not as restrictive.

BRIEF DESCRIPTION OF THE DRAWINGS

FIGS. 3A-3F are schematic illustrations of structures in various fabrication stages according to a method of the present disclosure.

DESCRIPTION OF BEST AND VARIOUS MODES

In order to facilitate an understanding of the present disclosure, reference is made to FIGS. 3A-3F which schematically illustrates a structure in various stages according to one process sequence of this disclosure.

Figure 1:
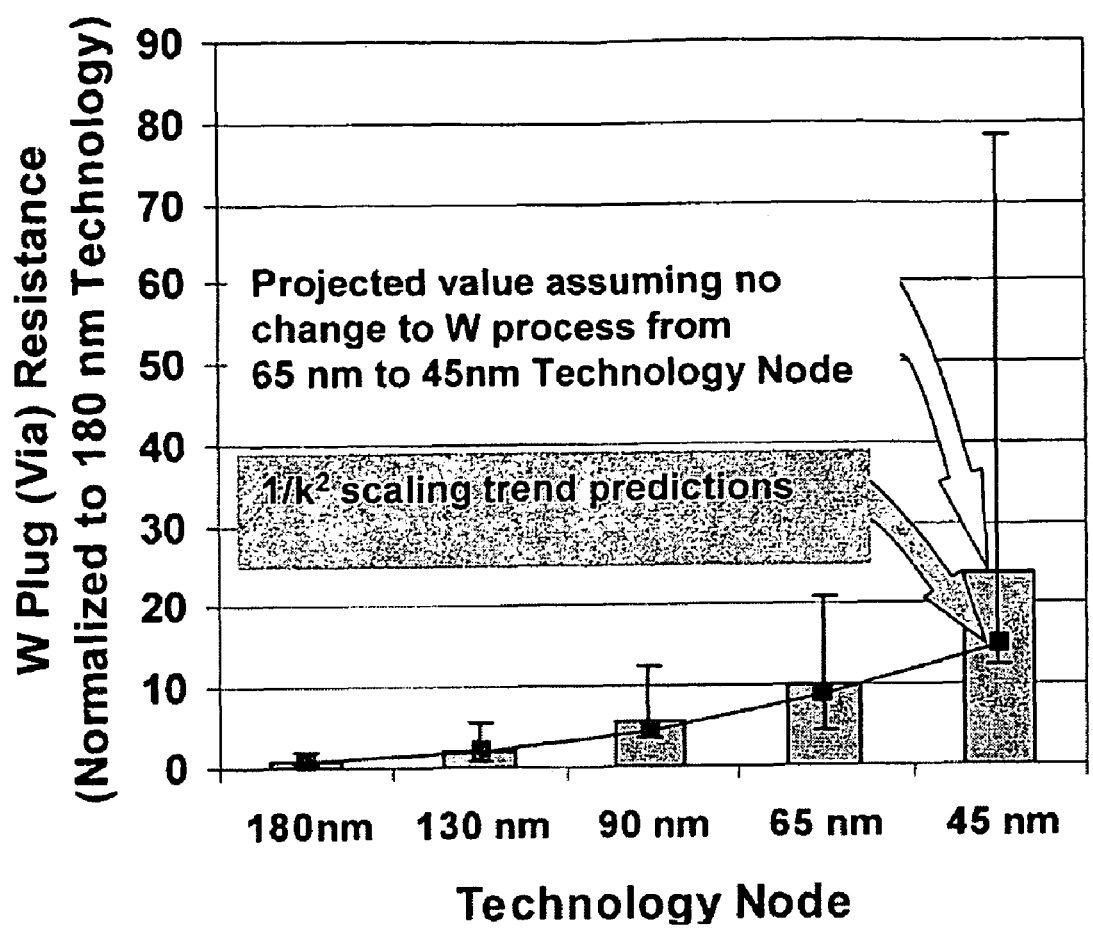
FIG. 1 shows CA resistance scaling as a function of technology node and scaling factor k.
Figure 2:
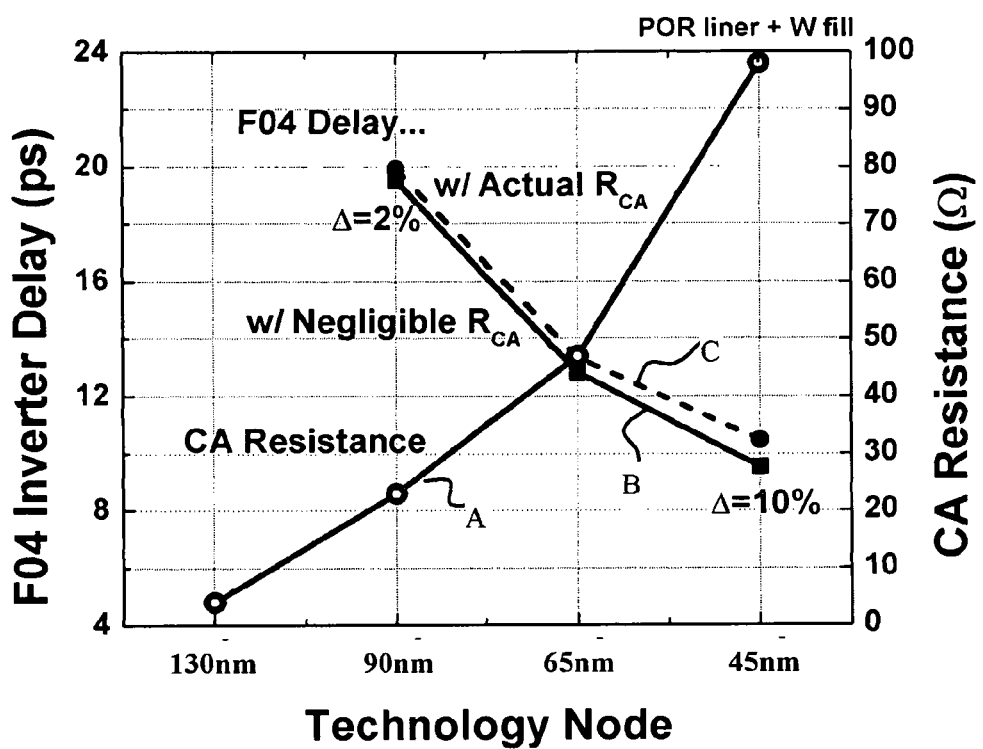
FIG. 2 is a graph illustrating calculated increase in contact resistance by extending present liner and CVD tungsten process that can result in 10% F04 Inverter Delay for 125 Technology.
Figure 3A:
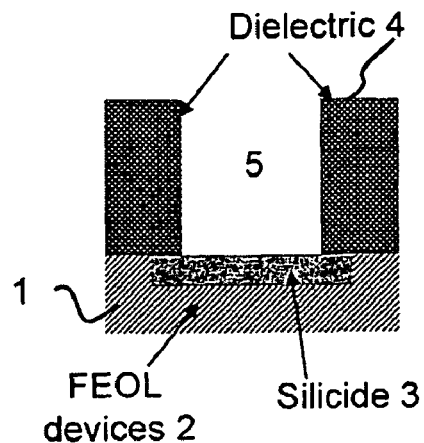
Figure 3B:
Figure 3B:
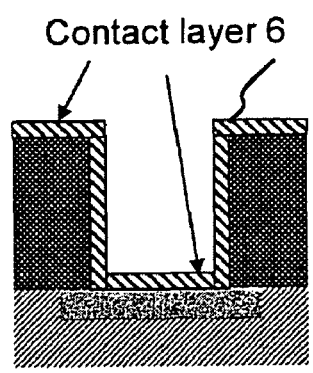

FIG. 3A shows a semiconductor substrate 1 such as a silicon or germanium substrate having front end of the line (FEOL) devices 2.

A metal silicide or germanide layer 3 is then formed on top of selected portions of FEOL devices such as by depositing the metal. Examples of typical metals for forming the metal silicide are cobalt (Co), nickel (Ni), platinum (Pt), ruthenium (Ru), iridium (Ir), palladium (Pd), osmium Os) and rhodium (Rh), with cobalt (Co) and nickel (Ni) being most typical. In addition, alloys can be used especially alloys of cobalt and/or nickel with an alloying metal such as platinum. A particular example being a nickel-platinum alloy. The metal is reacted at elevated temperatures with exposed regions of silicon on the substrate to form the silicide or exposed germanium to form a metal germanide. The silicide or germanide does not form over isolation regions of oxide and nitride that are present on the substrate. A selective chemical etch can be used to "self-align" the silicide or germanide and remove the un-reacted metal that are not desired. An additional annealing step can be carried out to reduce the resistivity of the silicide or germanide contact. The silicide or germanide layer 3 is typically thin such as about 5-40 nanometers and more typically about 15-25 nanometers.

Next a relatively thick blanket layer of dielectric layer 4 of about 0.2 microns to about 1 micron is deposited and then patterned by lithography and RIE (reactive ion etch) to form cavities (e.g. vias, bars and/or trenches) 5.

Examples of the dielectric layer 4 are silicon dioxide ($SiO_2$), phosphosilicate glass (PSG), boron doped PSG (BPSG), undoped silicate glass (USG), or tetraethylorthosilicate (TEOS), and more typically low-k dielectrics having a dielectric constant of less than 3.9 such as SILK (available from Dow Chemical), SiCH (available from AMAT under the trade designation BLOK), SiCOH (available from Novellus under the trade designation Coral, from AMAT under the trade designation Black Diamond and from ASM under the trade designation Auora), SiCHN (available from IBM under the trade designation N Blok), CVD carbon-doped oxide, porous CVD carbon-doped oxide, porous and non-porous organo silicates, porous and non-porous organic spin-on polymers.

The cavities 5 typically have a high aspect ratio such as at least about 3.

The cavities 5 land on top the silicide or germanide region.

A contact layer 6 is then deposited on the silicide or germanide layer 3 to contact the silicide or germanide layer 3, and on the sidewalls of cavities 5, and on top of the dielectric layer 4.

The contact layer 6 is typically titanium or a stack of titanium and titanium nitride. The titanium layer is typically about 50 to about 300 angstroms and more typically about 75 to about 200 angstroms thick. When present, the titanium nitride layer is between 10 to up to 100 angstroms. The titanium can be deposited by PVD or IPVD method, and TiN is deposited by CVD.

Figure 3C:
Figure 3C:
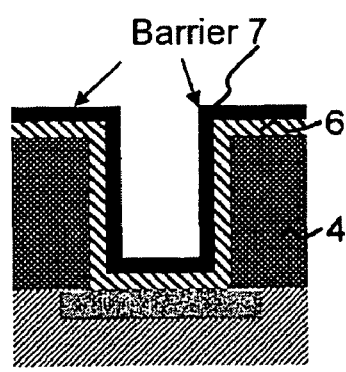
Figure 4:
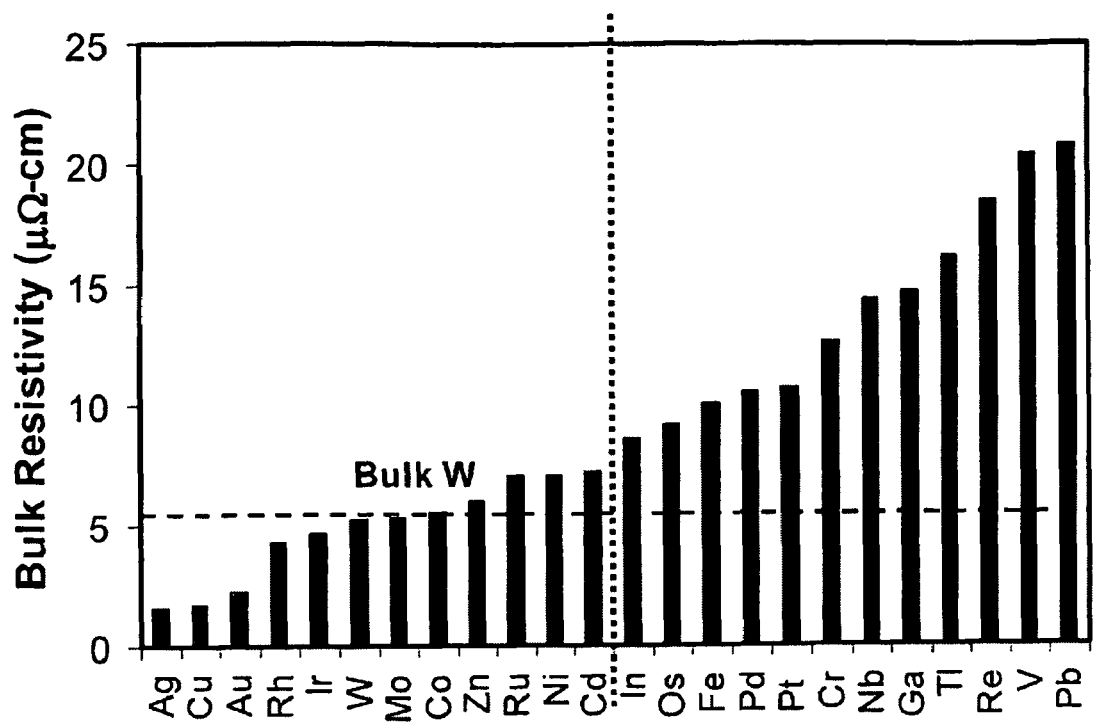
FIG. 4 shows the selection of metals based on bulk resistivity for electroplating to fill the plug structure. Ag, Cu, Au, Rh, Ir, Mo, Co, Zn, Ru, Cd, Ni, Cd and Zn have lower bulk resistivity than or comparable to bulk W resistivity of 5.3 $\mu\Omega$-cm.

Next, as shown in FIG. 3C, a barrier layer 7 is deposited on the contact layer 6 at the bottom and on the sidewalls of cavities 5. The barrier layer 7 acts as a diffusion barrier between the metal fill material and the dielectric layer 4 and the FEOL devices 2.

Typical barrier layers are various metals and/or their nitrides such as TaN, Ta, W, WN, Ti, TiN, and noble and/or refractory metals, such as Ru, Rh, Ir, Pt, Pd, Mo, Re and the alloys thereof. A plurality of different materials can be used if desired. For Cu, Ag, Au, Ni, Co, Cd, and Zn, which diffuse fast in silicon and silicon oxide, the more typical barrier material is Ta and even more typically alpha-phase Ta. The barrier layer 7 is typically about 10 to 200 angstroms thick and more typically about 30 to about 100 angstroms thick. Processes for depositing the barrier layer are well known and need not be discussed in any detail herein. By way of example, Ta can be deposited such as by the technique disclosed in U.S. Pat. No. 6,399,258 B1, disclosure of which is incorporated herein by reference.

The barrier layer 7 can be deposited by CVD (chemical vapor deposition), ALD (atomic layer deposition), or sputtering such as physical vapor deposition (PVD) or ionized physical vapor deposition (IPVD). One example of depositing is employing an HCM (Hollow Cathode Magnetron) magnetron sputter system, such as available from Applied Materials under the trade designation "Endura".

Typically, the sputter apparatus uses a DC magnetron source configuration and use as the source of tantalum, tantalum having a purity of about 99.9% or greater. In carrying out the process, an inert gas such as argon at a flow rate of about 50 to about 130 standard cubic centimeters per minute (sccm) is injected into the process cavity which contains the target along with the wafer upon which the tantalum is to be deposited. The process cavity prior to injection of the inert gas was previously evacuated to a vacuum level of a least $1.0 \times 10^{-6}$ torr using for example a cryogenic pump. Simultaneous to flowing the inert sputter gas, an additional gas flow of nitrogen is also begun at a flow rate of 20 to about 60 standard cubic centimeters per minute. The process cavity is filled with both gases to achieve an effective pressure of about 1 to about 10 million torr. The power typically employed to create a plasma for the purposes of the present disclosure is between 0.4 and 4.8 watts/square cm, and more typically about 1.6 to about 2.4 watts/square cm. Any combination of target voltage and current to achieve this power level can be employed. The material deposited is a highly oriented alpha-phase tantalum material. The deposition rate is typically about 1000 to about 2000 Å per minute.

As illustrated in FIG. 3D, an optional seed layer 8 can be deposited in cavities 5 on top of barrier layer 7 on the bottom and sidewalls of via 5. The seed layer 8 is optional and dependent on the barrier layer. If the barrier layer is conductive and can be directly electroplated on, then the seed layer is not required. Typical seed layers are: copper, rhodium, platinum, iridium, and ruthenium. The seed layer 8 can be deposited such as by PVD, CVD, atomic layer deposition, and electroless deposition techniques.

The seed layer 7, when employed, is typically about 20 to about 600 angstroms thick and more typically about 20 to 500 angstroms thick.

Next, as illustrated in FIG. 3E, the metal fill is electroplated to fill the contact structure. The metal fill layer is typically Cu, Rh, Ru, Ir, Mo, Au, Ag, Ni, Co, Cd, Zn and alloys thereof, and more typically Cu, Rh and Ru. Examples of alloys include alloys with metals such as tungsten and/or light doping elements such as B, P, Cl, S, O, N, F, C, Br, and I. Typically the amount of alloying material is up to about 15 atomic %.

Typical methods suitable for this disclosure for electrodepositing copper and copper alloys can be found in U.S. Pat. No. 6,709,562 to Andricacos et al., disclosure of which is incorporated herein by reference. The electroplating employs the so called super filling electroplating techniques.

Copper plating from solutions incorporating additives used to produce level deposits on a rough surface can be used to accomplish superfilling preferred to fill sub micron cavities. Some additives commercially available are available from Shipley Company, Marlboro, Mass. under the trade designations C-2001 for a carrier, B-2001 for a brightener, A-2001 for an accelerator, S-2001 for a suppressor and L-2001 for a leveler. A suitable system of additives is the one marketed by Enthone-OMI, Inc., of New Haven, Conn. and is known as the Via Form system. Another suitable system of additives is the one marketed by LeaRonal, Inc., of Freeport, N.Y., and is known as the Copper Gleam 2001 system. The additives are referred to by the manufacturer as Copper Gleam 2001 Carrier, Copper Gleam 2001-HTL, and Copper Gleam 2001 Leveller. And another suitable system of additives is the one marketed by Atotech USA, Inc., of State Park, Pa., and is known as the Cupracid HS system. The additives in this system are referred to by the manufacturer as Cupracid Brightener and Cupracid HS Basic Leveller.

Examples of specific additives which may be added to a bath in the instant disclosure are described in several patents. U.S. Pat. No. 4,110,176, which issued on Aug. 29, 1978, to H-G Creutz deceased et al., entitled "Electrodeposition of Copper" described the use of additives to a plating bath such as poly alkanol quaternary-ammonium salt which formed as a reaction product to give bright, highly ductile, low stress and good leveling copper deposits from an aqueous acidic copper plating bath which patent is incorporated herein by reference. U.S. Pat. No. 4,376,685, which issued on Mar. 15, 1983, to A. Watson, entitled "Acid Copper Electroplating Baths Containing Brightening and Leveling Additives," described additives to a plating bath such as alkylated polyalkyleneimine which formed as a reaction product to provide bright and leveled copper electrodeposits from an aqueous acidic bath which patent is incorporated herein by reference. U.S. Pat. No. 4,975,159, which issued on Dec. 4, 1990, to W. Dahms, entitled "Aqueous Acidic Bath for Electrochemical Deposition of a Shiny and Tear-free Copper Coating and Method of Using Same," described adding to an aqueous acidic bath combinations of organic additives including at least one substituted alkoxylated lactam as an amide-group-containing compound in an amount to optimize the brightness and ductility of the deposited copper, which patent is incorporated herein by reference.

In U.S. Pat. No. 4,975,159, Table I lists a number of alkoxylated lactams which may be added to a bath in the instant disclosure. Table II lists a number of sulfur-containing compounds with water-solubilizing groups such as 3 mercaptopropane-1-sulfonic acid which may be added to a bath in the instant disclosure. Table III lists organic compounds such as polyethylene glycol which may be added to a bath as surfactants in the instant disclosure.

U.S. Pat. No. 3,770,598, which issued on Nov. 6, 1973, to H-G Creutz, entitled "Electrodeposition of Copper from Acid Baths," describes baths for obtaining ductile, lustrous copper containing therein dissolved a brightening amount of the reaction product of polyethylene imine and an alkylating agent to produce a quaternary nitrogen, organic sulfides carrying at least one sulfonic group, and a polyether compound such as polypropylene glycol, which patent is incorporated herein by reference.

U.S. Pat. No. 3,328,273, which issued on Jun. 27, 1967, to H-G Creutz et al., entitled "Electrodeposition of Copper from Acidic Baths," describes copper sulfate and fluoborate baths for obtaining bright, low-stress deposits with good leveling properties that contain organic sulfide compounds of the formula XR1-(Sn)—$R_2$—$SO_3H$, where R1 and $R_2$ are the same or different and are polymethylene groups or alkyne groups containing 1-6 carbon atoms, X is hydrogen or a sulfonic group, and n is an integer of S 2-S inclusive, which patent is incorporated herein by reference. Additionally these baths may contain polyether compounds, organic sulfides with vicinal sulphur atoms, and phenazine dyes. In U.S. Pat. No. 3,328,273, Table I lists a number of polysulfide compounds which may be added to a bath in the instant disclosure. Table II lists a number of polyethers which may be added to a bath in the instant disclosure.

Additives may be added to the bath for accomplishing various objectives. The bath may include a copper salt and a mineral acid. Additives may be included for inducing in the conductor specific film microstructures including large grain size relative to film thickness or randomly oriented grains. Also, additives may be added to the bath for incorporating in the conductor material molecular fragments containing atoms selected from the group consisting of C, O, N, S and Cl whereby the electromigration resistance is enhanced over pure Cu. Furthermore, additives may be added to the bath for inducing in the conductor specific film microstructures including large grain size relative to film thickness or randomly oriented grains, whereby the electromigration behavior is enhanced over non electroplated Cu.

Similar superfilling results are obtainable from a solution containing cupric sulfate in the rate from 0.1 to 0.4M, sulfuric acid in the range from 10 to 20% by volume, chloride in the range from 10 to 300 ppm, and LeaRonal additives Copper Gleam 2001 Carrier in the range from 0.1 to 1% by volume, Copper Gleam 2001 HTL in the range from 0.1 to 1% by volume, and Copper Gleam 2001 Leveller in the range 0 to 1% by volume. Finally, similar superfilling results are obtainable from a solution containing cupric sulfate, sulfuric acid, and chloride in the ranges mentioned above and Atotech additives Cupracid Brightener in the range from 0.5 to 3% by volume and Cupracid HS Basic Leveller in the range from 0.01 to 0.5% by volume.

In another example, Rh is electrodeposited from a bath commercially available under the trade designation "Rhodex 100" from Enthone OMI. The bath contains about 5 g/l of Rh, 30 ml/l sulfuric acid, and 100 ml/l sulfamic acid based stress reducer additive under the trade designation of "Rhodex 100 stress reducer". Rhodium is typically deposited at a current density range of 2-20 mA/cm² with current efficiencies of greater than about 30%. It is preferred to control the deposition rate to a current density range in order to control deposit stress and maintain practical current efficiency. The deposition temperature is between 15-60° C. Lower resistivity is obtained with lower temperature. A 200 nm thick thin film of electrodeposited Rh at 50° C. is measured to have a resistivity about 45 microohm-cm, and when annealed at a temperature higher than 200° C. in nitrogen or forming gas (mixture of hydrogen and nitrogen) the resistivity decreased to about 10 microohm-cm. A 200 nm thick thin film of electrodeposited Rh at 20° C. is measured to have a resistivity about 20 microohm-cm, and when annealed at a temperature higher than 200° C. the resistivity decreased to about 6.5 microohm-cm. By comparison, a CVD W thin film resistivity is usually higher than 13 microohm-cm.

Rh can also be deposited from other commercial baths, such as "Techni-Rhodium" from Technic Inc. A Rh plating solution can also be made using $Rh_2(SO_4)_3$ (2-10 g/l of Rh), 10 ppm-10% of Cl, 10-50 ml/l sulfuric acid, and 30-80 ml/l sulfamic acid.

When the metal fill 9 is at least one member of rhodium, ruthenium, or iridium, the diffusion barrier layer 7 is not required since rhodium, ruthenium, and iridium do not diffuse in silicon.

In a further example, ruthenium is the fill metal 9. A typical ruthenium electroplating process, employs a solution containing about 2-5 g/l of ruthenium prepared from nitrosylsulfate ruthenium salt and about 20 g/l $H_2SO_4$. Typical deposition temperatures are about 50° to about 70° C. and more typically about 60° to about 70° C. with a current efficiency of about 15 to about 30%. The current density is typically about 5 mA/cm² to about 100 mA/cm² and more typically about 10 mA/cm². The work piece (wafer) is typically rotated at about 50 to about 120 rpm, with about 90 rpm being preferred. The time varies depending upon the desired thickness, but is typically less than about 1000 seconds.

In another ruthenium electroplating example, a commercially available bath available under the trade designation "Ruthenex SP" from Enthone OMI is modified to contain about 4 g/l Ru to about 12 g/l Ru. In addition, the "Ruthenex SP" bath contains relatively large amounts of Mg salts and relatively small amounts of Ni. Mg deposits with the Ru metal and acts as a stress reducer.

Next as illustrated in FIG. 3F, the structure can be planarized and the overburden of the various layer removed, for example by chemical mechanical polishing (CMP).

Examples of some contact structures according to this disclosure are Ti/TiN/TaN/Ta/Cu seed/plated Cu; Ti/TaN/Ta/Cu seed/plated Cu; Ti/TaN/Ta/Ru seed/plated Cu; Ti/TiN/TaN/Ru seed/plated Rh; Ti/TiN/TaN/Ru seed/plated Ru; Ti/Ru seed/plated Rh; and Ti/Ru seed/plated Ru. Contact structures according to this disclosure show lower resistance than existing contact structures made of Ti/TiN/CVD W.

The following non-limiting examples are presented to further illustrate the present disclosure.

EXAMPLE 1

Figure 5:
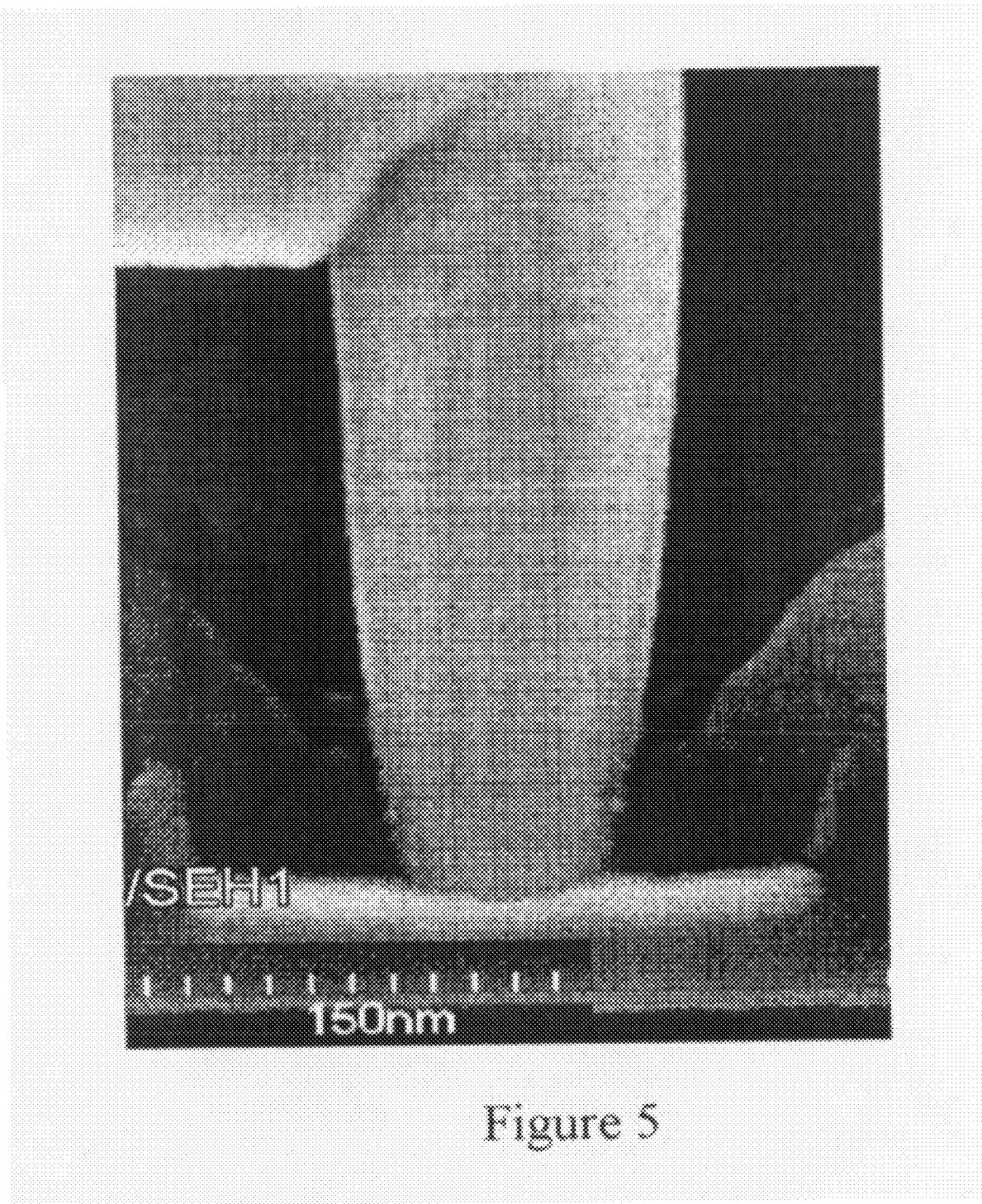
FIG. 5 is a SEM showing high aspect ratio contact vias filled by a copper damascene process and being free of voids or center seams. The metallurgy structure stack is composed of Ti/TiN/TaN/Ta/Cu seed/Cu fill from plating.
Figure 6:
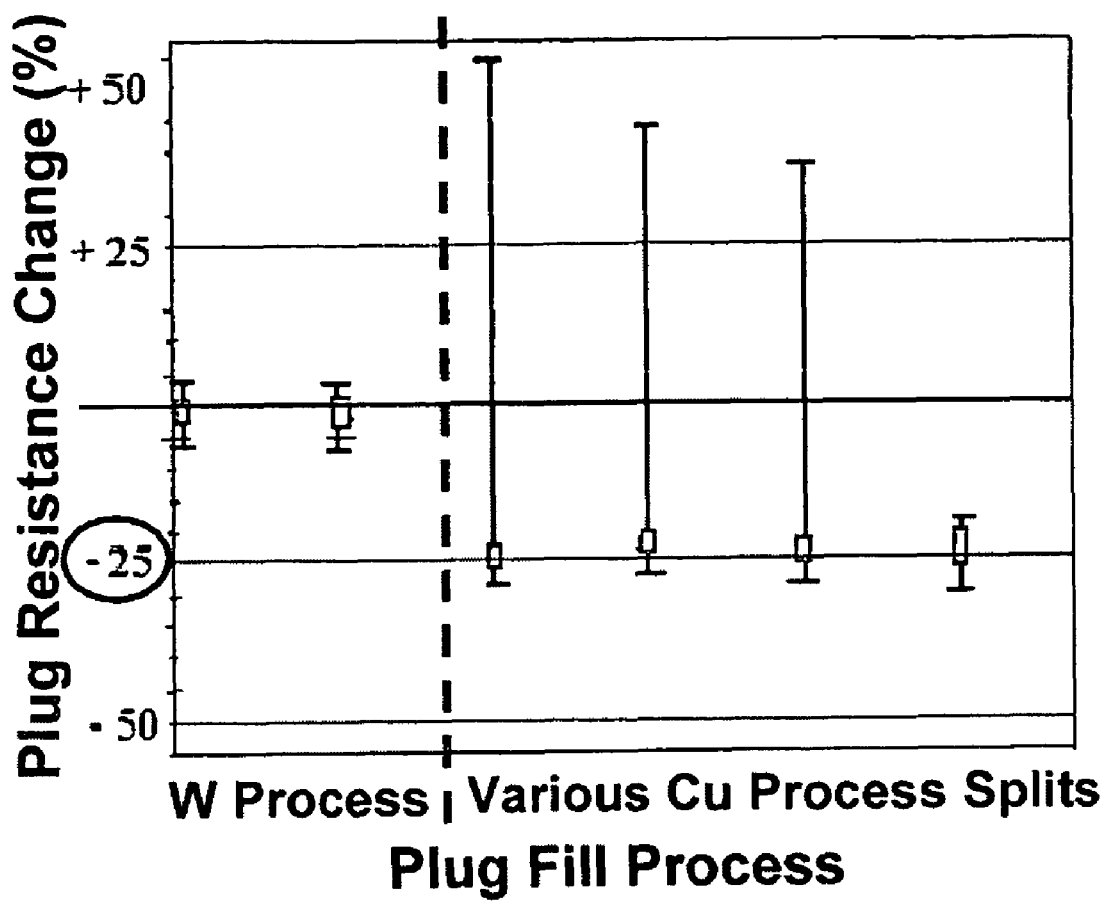
FIG. 6 is a chart illustrating experimental data exhibiting lower contact resistance from contacts filled with copper as shown in FIG. 5 as compared to vias filled with tungsten.

A 300 mm silicon wafer with a structure comprising a silicide contact layer about 20 nm thick, a patterned BPSG dielectric; a 100 angstrom Ti/40 angstrom TiN contact layer; a 20 angstrom TaN/40 angstrom Ta barrier layer, a copper seed layer about 400 angstroms thick and a copper metal fill. The copper fill is electrodeposited using a composition comprising EC3003 (40 g/l CuSO$_4$, 10-100 g/l H$_2$SO$_4$; 50 ppm Cl), 15 ml/l A-3001 (an accelerator) and 2 ml/l S-3001 (a suppressor) and 1.5 ml/l L-3001 (a leveler) (Shipley); a plating current waveform: 6.5 mA/cm$^2$ for 2 seconds—9.8 mA/cm$^2$ for 30 seconds—24.5 mA/cm$^2$ for 58 seconds at 90 rpm. FIG. 5 is a SEM of this structure. As can be seen, the high aspect ratio vias are filled without any voids or seams. Cu has a much lower resistivity than W, and Cu plating also eliminates voids, therefore the contact plugs filled with Cu using electroplating method can give an overall lower contact plug resistance than the W contact plugs. FIG. 6 shows a chart illustrating experimental data exhibiting 25% lower contact resistance from the above structure filled with copper as compared to vias filled with tungsten. In these examples Ti is the contact layer to silicide. TiN, TaN, and Ta are barrier layers for Cu diffusion.

EXAMPLE 2

A 300 mm silicon wafer with a structure comprising a cobalt silicide layer about 20 nm thick; USG dielectric with patterned vias of 65 nm×250 nm dimensions; a PVD TaN barrier layer about 50 angstrom thick; an ALD or CVD ruthenium seed layer about 80 angstrom thick and electroplated rhodium metal fill. The rhodium fill is electroplated using a solution available under the trade designation Rhodex 100 from Enthone-OMI (50 ml/l Rhodex 100 (5 g/l Rh metal concentration) and 30 ml/l sulfuric acid and 100 ml/l Rhodex 100 stress reducer) at a current density of about 4.5 mA/cm$^2$ at about 20° C. using 10 rpm rotation rate for about 10 minutes.

Figure 7:
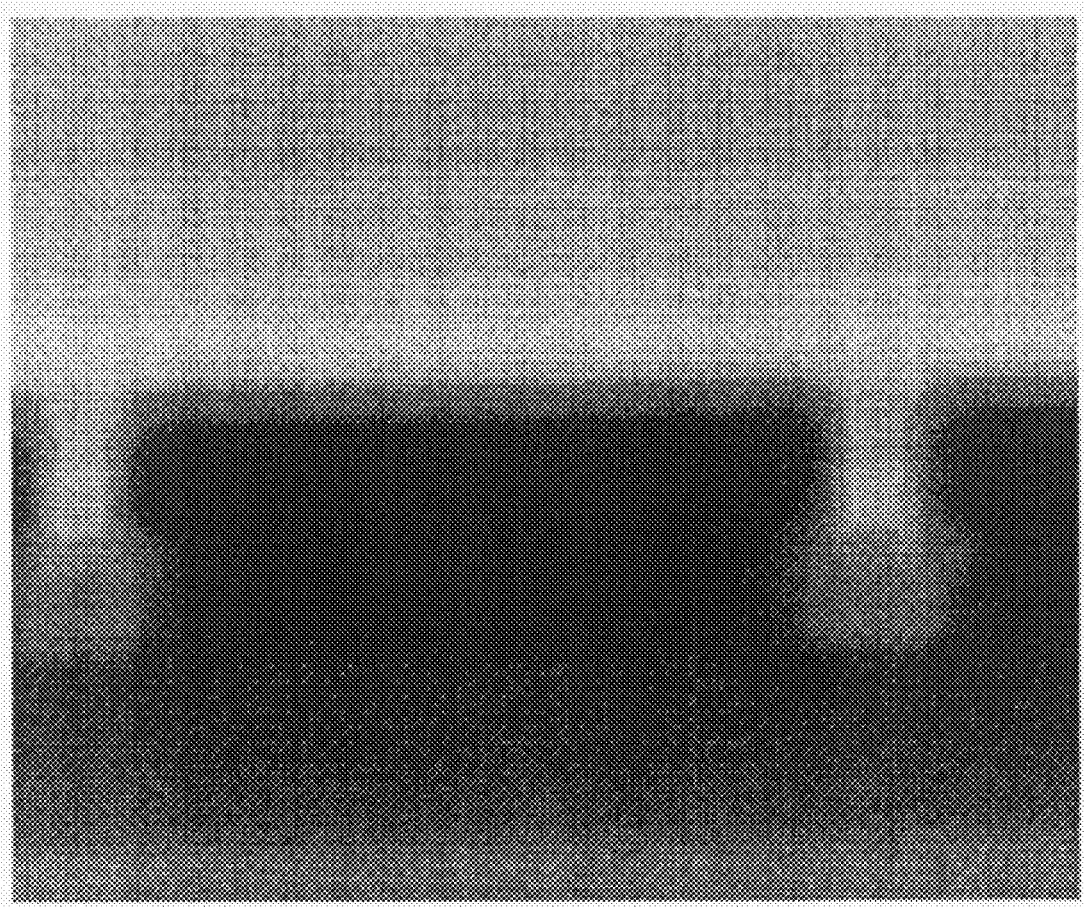
FIG. 7 is a SEM showing contact vias filled with plated rhodium and being void free. The metallurgy structure stack is composed of Ti/TiN/TaN/ALD Ru seed/Rh fill from plating.

FIG. 7 is a SEM of this structure. As shown the high aspect ratio vias are filled without any voids or center seams. The low resistivity of Rhodium combined with void-free fill of these high aspect ratio plugs can give an overall lower contact plug resistance than the W contact plugs.

EXAMPLE 3

A structure comprising a patterned USG dielectric with vias of 125 nm×560 nm dimensions; an atomic layer deposited (ALD) TaN barrier layer; an ALD ruthenium seed layer and electroplated ruthenium metal fill. The ruthenium fill is electroplated using a composition of 5.5 g/l ruthenium nitrosylsulfate and 5.5 ml/l sulfuric acid at a temperature of 65° C. with a current density 10 mA/cm$^2$ for about 10 minutes.

Figure 8:
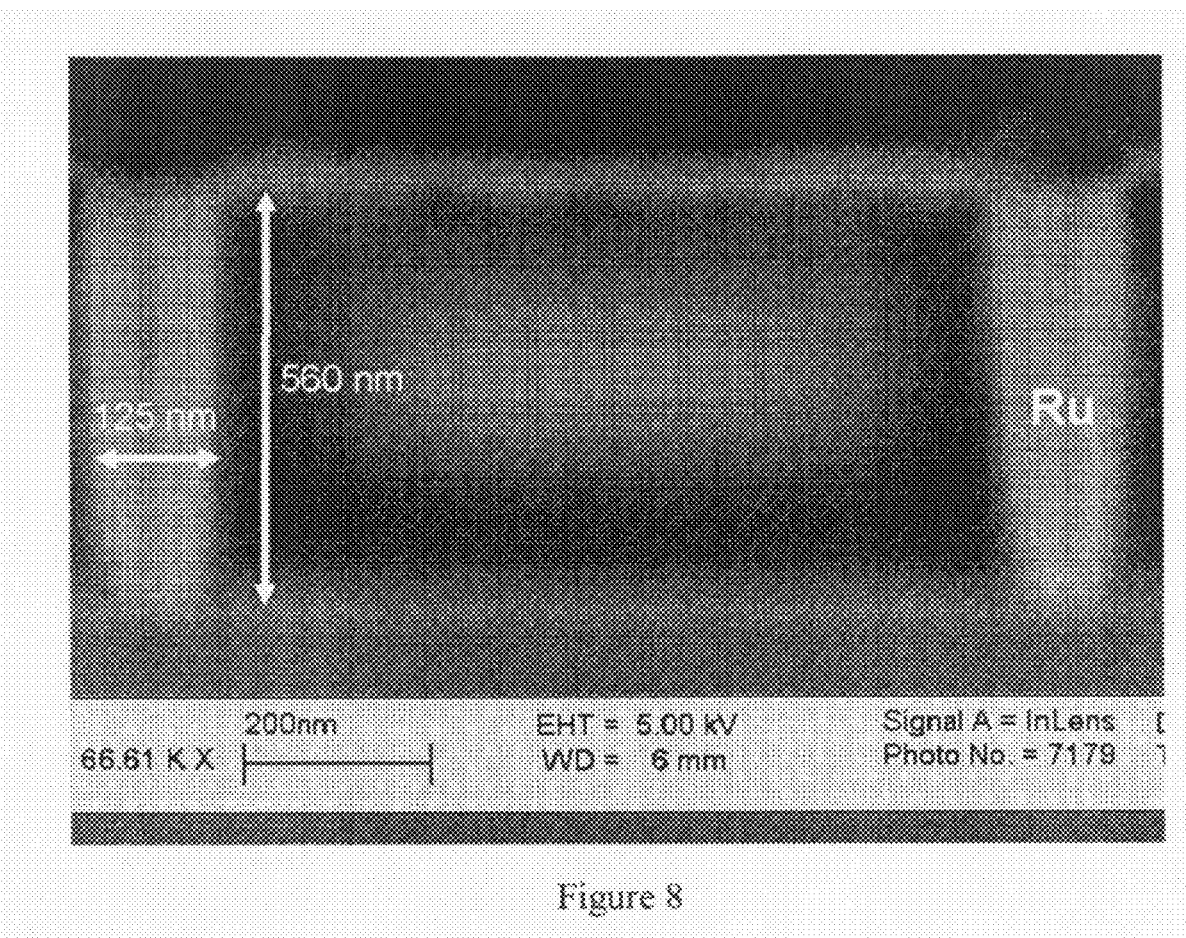
FIG. 8 is a SEM showing high aspect ratio contact vias filled with plated ruthenium and exhibiting only a very slim center seam. The metallurgy structure stack is composed of ALD TaN/ALD Ru seed/Ru fill from plating.

FIG. 8 is as SEM of this structure. As shown, the high aspect ratio vias are filled with a slim center seam, which is better than gross voids resulted in CVD W process. Electroplating of Ru can also give an overall lower contact plug resistance than the W contact plugs.

The foregoing description illustrates and describes the disclosure. Additionally, the disclosure shows and describes only the preferred embodiments but, as mentioned above, it is to be understood that it is capable to use in various other combinations, modifications, and environments and is capable of changes or modifications within the scope of the invention concepts as expressed herein, commensurate with the above teachings and/or the skill or knowledge of the relevant art. The embodiments described herein above are further intended to explain best modes known by applicant and to enable others skilled in the art to utilize the disclosure in such or other embodiments and with the various modifications required by the particular applications or uses thereof. Accordingly, the description is not intended to limit the invention to the form disclosed herein. Also, it is intended to the appended claims be construed to include alternative embodiments.

All publications and patent applications cited in this specification are herein incorporated by reference, and for any and all purposes, as if each individual publication or patent application were specifically and individually indicated to be incorporated by reference.

What is claimed as new and desired to be protected by Letters Patent of the United States is:

1. A method for fabricating a contact metallurgy structure which comprises:
    obtaining a patterned dielectric layer having cavities located on a substrate;
    forming a silicide or germanide layer located at the bottom of cavities;
    providing a contact layer comprising Ti located in cavities contacting the silicide or germanide on the bottom of the cavities and on top of the dielectric layer;
    depositing a diffusion barrier layer located in cavities and on top of the contact layer;
    and electroplating a metal fill layer of at least one member selected from the group consisting of copper, ruthenium, rhodium, iridium, molybdenum, gold, silver, nickel, cadmium, zinc and cobalt and alloys thereof.

2. The method of claim 1 wherein the diffusion barrier layer is at least one member selected from the group consisting of ruthenium, platinum, iridium, and rhodium.

3. The method according to claim 1 which further comprises planarizing by CMP after the electroplating.

4. The method according to claim 1 wherein the cavities have an aspect ratio of at least 3.

5. The method according to claim 1 wherein the metal fill comprises copper, rhodium, ruthenium, iridium, silver, gold, nickel, cobalt, molybdenum, or zinc or alloys thereof, or alloys of these metals with W, or light doping elements of P, B, S, Cl, O, N, F, Br, and I.

6. A method for fabricating a contact metallurgy structure which comprises
    obtaining a patterned dielectric layer having cavities located on a substrate;
    forming a silicide or germanide layer located at the bottom of cavities;
    providing a contact layer comprising Ti located in cavities contacting the silicide or germanide layer at the bottom of the cavities and on top of the silicide or germanide layer;
    electroplating a metal fill layer comprising rhodium, ruthenium, or iridium or an alloy thereof.

7. The method of claim 6 which further comprises providing barrier layer in cavities and on top of the contact layer and depositing a seed layer between the barrier layer and metal fill.

8. The method according to claim 6 which further comprises planarizing by CMP after the electroplating.

* * * * *